United States Patent [19]

Inui et al.

[11] Patent Number: 5,573,885
[45] Date of Patent: Nov. 12, 1996

[54] IMAGE FORMING METHOD AND RECORDING MEDIUM

[75] Inventors: Toshiharu Inui; Haruhiko Moriguchi, both of Yokohama; Norio Ohkuma, Machida; Masanori Takenouchi; Masashi Miyagawa, both of Yokohama, all of Japan

[73] Assignee: Canon Kabushiki Kaisha, Tokyo, Japan

[21] Appl. No.: 331,869

[22] Filed: Nov. 1, 1994

Related U.S. Application Data

[63] Continuation of Ser. No. 774,657, Oct. 15, 1991, abandoned, which is a continuation of Ser. No. 611,472, Nov. 13, 1990, abandoned, which is a continuation of Ser. No. 228,505, Aug. 5, 1988, abandoned.

[30] Foreign Application Priority Data

Aug. 7, 1987 [JP] Japan .................................. 62-197963

[51] Int. Cl.$^6$ .............................. G03C 1/72; G03C 8/00; G03C 11/12; B32B 3/00
[52] U.S. Cl. .......................... 430/138; 430/203; 430/253; 430/259; 430/330; 428/195; 428/913; 428/914
[58] Field of Search .................................. 430/138, 41, 42, 430/46, 203, 253, 259, 281, 284, 285, 259, 281.1, 284.1, 285.1, 330; 428/198, 913, 914, 195

[56] References Cited

U.S. PATENT DOCUMENTS

| | | | |
|---|---|---|---|
| 4,440,846 | 4/1984 | Sanders et al. | 430/138 |
| 4,632,899 | 12/1986 | Takeda | 430/292 |
| 4,675,269 | 6/1987 | Saccocio et al. | 430/138 |
| 4,701,397 | 10/1987 | Rourke et al. | 430/138 |
| 4,713,312 | 12/1987 | Adair et al. | 430/138 |
| 4,840,866 | 6/1989 | Kovacs et al. | 430/138 |
| 4,948,694 | 8/1990 | Ohkuma et al. | 430/138 |
| 4,952,478 | 8/1990 | Miyagawa et al. | 430/138 |
| 4,973,542 | 11/1990 | Takenouchi et al. | 430/138 |
| 4,977,058 | 12/1990 | Miyagawa et al. | 430/138 |
| 4,992,351 | 2/1991 | Ohkuma et al. | 430/138 |
| 5,005,028 | 4/1991 | Tamura | 346/76 R |
| 5,015,552 | 5/1991 | Tamura et al. | 430/138 |

FOREIGN PATENT DOCUMENTS 205083 12/1986 European Pat. Off. ............... 400/120

*Primary Examiner*—George F. Lesmes
*Assistant Examiner*—Bernard P. Codd
*Attorney, Agent, or Firm*—Fitzpatrick, Cella, Harper & Scinto

[57] ABSTRACT

A transfer recording medium comprising a substrate and a distributed layer of image forming elements, and an image forming method using the recording medium are provided. The distributed layer comprises first and second image forming elements. The first image forming elements comprise at least two species of different coloring characteristics which are capable of decreasing their transferabilities when provided with at light and heat energy under respectively prescribed at least two energy application conditions corresponding to the coloring characteristics. The second image forming element is capable of decreasing its transferability under any one of the at least two energy application conditions.

12 Claims, 3 Drawing Sheets

IMAGE FORMING METHOD AND RECORDING MEDIUM

This application is a continuation of application Ser. No. 07/774,657 filed Oct. 15, 1991, now abandoned which is a continuation of application Ser. No. 07/611,472 filed Nov. 13, 1990, now abandonded, which is a continuation of application Ser. No. 07/228,505 filed Aug. 5, 1998, now abandoned.

FIELD OF THE INVENTION AND RELATED ART

The present invention relates to an image forming method capable of forming an image by utilizing a difference in wavelength of light energy, and a recording medium suitably used therefor.

Hitherto, there have been known various methods of forming an image utilizing photopolymerization or thermal transfer.

As the methods of forming a plate or an image by photopolymerization, Japanese Patent Publication (JP-B, KOKOKU) Nos. 18979/1962 and 9672/1963 disclose a method wherein a layer of a photopolymerizable composition is disposed on a substrate, which is then exposed patternwise to form an image comprising polymerized and non-polymerized portions, and the image is transferred to another substrate by utilizing the resultant difference in adhesion or transferability. Further, Japanese Patent Publication No. 8436/1964 discloses a method wherein a photopolymerizable composition sandwiched between a substrate and a covering sheet is exposed, and then the substrate and the covering sheet are separated to obtain an image.

Further, U.S. Pat. No. 4,399,209 discloses an image forming method wherein photopolymerization is applied to color recording. In this method, there is used a recording medium comprising a substrate paper, a chromogenic layer applied thereon, and microcapsules of a radiation-curable material randomly disposed on the chromogenic layer which can show each of the three primary colors of yellow, magenta and cyan by reacting with the chromogenic layer, and have selectivity to wavelengths. Such a recording medium is sequentially subjected to positive exposures corresponding to the three primary colors, and thereafter it is pressed so that the uncured microcapsules are ruptured and react with the chromogenic layer to develop the color, whereby a multi-color image is obtained.

Further, U.S. Pat. No. 4,416,966 discloses a "self-contained" image forming system wherein an image-forming sheet comprising photosensitive microcapsules and a developer both disposed on the same surface of a substrate is used. In this system, the image-forming sheet is exposed mainly to ultraviolet rays exchanged corresponding to an image to be recorded, and then it is passed through pressing rollers so that the microcapsules are ruptured and the internal phase thereof is ejected imagewise. At this time, a chromogenic material migrates to the developer ordinarily disposed in another layer and the chromogenic material reacts therein to form a multi-color image.

On the other hand, the thermal or heat-sensitive transfer recording method has recently been developed with the rapid progress in the information industry.

The thermal recording method generally employs an ink ribbon comprising a heat-transferable ink containing a colorant dispersed in a heat-fusible binder, which is applied to a support generally in the form of a ribbon, and effects recording on a recording paper. The recording is generally conducted by superposing the ink ribbon on the recording paper so that the heat-transferable ink layer will contact the recording paper while covering the ink ribbon and the recording paper to a portion between a thermal head and a platen, supplying a heat pulse from the support side of the ink ribbon by means of the thermal head corresponding to an image signal while causing the ink ribbon to contact the recording paper to transfer the melted ink to the recording paper, whereby a transferred ink image corresponding to the heat supplying pattern is formed on the recording paper.

The above-mentioned thermal transfer recording method has recently been widely used because it has advantages such that the apparatus employed is light in weight, compact, free of noise, and also has other advantages such that it can effect recording on plain paper.

In each of the above-mentioned image forming methods using photopolymerization, only light energy (mainly of ultraviolet rays) is used for forming a latent image on a recording medium, so that a recording medium highly sensitive to light or a light flux of a high energy is required in order to obtain a clear image at a high speed. A high sensitivity recording medium only utilizing light energy is also sensitive under no application of light, and therefore it has a relatively poor storage stability in the neighborhood of room temperature.

Further, in the above-mentioned method, since only light energy is used for forming a latent image on a transfer recording medium, it is not suitable in a case where an image is outputted depending on an external signal in an apparatus such as a printer, or in a case where image information read from a multi-color original is converted into a digital signal by using a color-image scanner and then imparted to a recording medium. More specifically, a light flux having a shorter wavelength, mainly of ultraviolet rays, is required in order to radiate a light of high energy, but there has not been obtained a light source which can digitally control ultraviolet rays. For example, an optical head such as a liquid crystal shutter array and an LED array has been proposed in order to obtain a digital light source. However, although these heads are suitable for miniaturization, ultraviolet rays cannot stably be obtained thereby because liquid crystal molecules deteriorate in an ultraviolet wavelength region.

Further, the recording medium used in the above-mentioned image forming method disclosed in U.S. Pat. Nos. 4,399,209; and 4,416,966 utilizes a color-forming reaction of a leuco dye so that the resultant recorded image is essentially inferior in stability.

Further, in the above-mentioned image forming method wherein microcapsules are ruptured to form a color, in order to facilitate the development through pressure-application, the enclosed material in the microcapsules is required to be formed as a photosensitive composition which is liquid at room temperature, and therefore provides a poor storability. Moreover, the resultant image is accompanied with an odor of a monomer because a non-reacted material is ruptured, thus providing a practically undesirable characteristic.

On the other hand, in the conventional thermal transfer recording method, it has been required to repeat the transfer plural times of transfer to superpose colors in order to obtain a multi-color image.

Accordingly, there have been experienced difficulties such as the provision of plural thermal heads or complex movement involving reverse movement and stopping of a recording paper, so that it has been difficult to obtain an image free of color deviation or aberration, and the apparatus used therefor undesirably becomes large and complex.

In order to solve the above-mentioned problems, our research group has proposed an image forming method wherein a transfer recording is effected on a transfer-receiving medium such as paper by using plural kinds of energies (U.S. Pat. No. 5,015,552).

According to this novel image forming method, a high-quality image can be obtained even on a transfer-receiving medium (or medium to be recorded on) with low surface smoothness, and a multi-color image can be obtained without complex movement of the transfer-receiving medium.

Further, our research group has proposed a recording method wherein the above-mentioned recording method of U.S. Pat. No. 5,015,552 is improved in fixing (U.S. Pat. No. 4,990,931), and a recording method wherein a vaporizable dye is applied to the above recording method (U.S. patent application Ser. No. 070,194). Our research group has also proposed several recording media suitably used in the above image forming method in U.S. Pat. No. 5,034,301, U.S. Pat. No. 4,952,478, U.S. Pat. No. 4,977,058, U.S. Pat. No. 4,948,694, U.S. No. 4,973,542 and U.S. Pat. No. 4,992,351, and another image forming method obtained by the application of the above-mentioned image forming method of U.S. Pat. No. 5,015,552 (U.S. patent application Ser. No. 127,386).

Furthermore, our research group has proposed several image forming apparatus suitably used in the image forming method of U.S. Pat. No. 5,005,028 (U.S. Pat. No. 5,072,245, U.S. Pat. No. 4,891,652; U.S. Pat. No. 4,887,095; U.S. Pat. No. 4,899,175; etc.)

Now, in a case where a recording medium comprising a photosensitive material having a selectivity to wavelength is used and a multi-color image is formed by changing the wavelength of light energy supplied to the recording medium, there are required a plurality of photosensitive materials which have different sensitive wavelength regions corresponding to the number of colors. More specifically, it is necessary to use three or four species of photosensitive materials having different sensitive wavelength regions corresponding to three or four colors, respectively. However, it is difficult to provide three or four species of photosensitive materials so that their sensitive wavelength regions do not overlap each other.

SUMMARY OF THE INVENTION

A principal object of the present invention is to provide an image forming method and a recording medium capable of providing a multi-color image of high quality at a high recording speed.

Another object of the present invention is to provide an image forming method and a recording medium, wherein the number of species of photosensitive materials is smaller than that of colors to be recorded.

According to the present invention, there is provided an image forming method, comprising the steps of:

providing a recording medium comprising a substrate and a distributed layer disposed thereon comprising a plurality of first image forming elements and a plurality of second image forming elements; the first image forming elements comprising at least two species of different coloring characteristics which are capable of decreasing their transferabilities when provided with at least light energy under respectively prescribed at least two energy application conditions corresponding to the coloring characteristics; the second image forming element being capable of decreasing its transferability under any one of the at least two energy application conditions;

imparting at least light energy to the recording medium corresponding to a recording information signal to selectively decrease the transferability of said first image forming element so that the transferability of the second image forming element is decreased along with the decrease in transferability of the first image forming element of at least one coloring characteristic, whereby a transferable portion is formed in said distributed layer; and transferring the transferable portion of the distributed layer to a transfer-receiving medium, thereby to form an image corresponding to the transferable portion on the transfer-receiving medium.

The present invention also provides a recording medium comprising: a substrate and a distributed layer disposed thereon comprising a plurality of first image forming elements and a plurality of second image forming elements; the first image forming elements comprising at least two species of different coloring characteristics which are capable of decreasing their transferabilities when provided with at least light energy under respectively prescribed at least two energy application conditions corresponding to the coloring characteristics; the second image forming element being capable of decreasing its transferability under any one of the at least two energy application conditions.

These and other objects, features and advantages of the present invention will become more apparent upon a consideration of the following description of the preferred embodiments of the present invention taken in conjunction with the accompanying drawings.

DETAILED DESCRIPTION OF THE INVENTION

Figure 1:
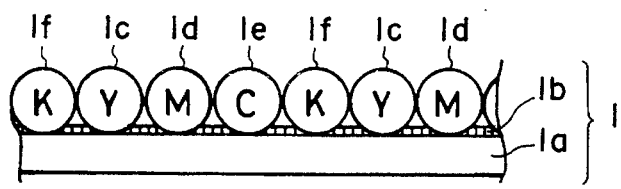
FIG. 1 is a schematic sectional view showing an embodiment of the recording medium according to the present invention.

Referring to FIG. 1, the recording medium according to the present invention may preferably comprise a substrate 1a, a binder layer 1b disposed on the substrate 1a, and a plurality of image forming elements 1c, 1d, 1e and 1f bonded to the substrate 1a by the binder layer 1b.

In the embodiment shown in FIG. 1, for example, each image forming element comprises a functional or sensitive component and a colorant so as to provide any one color selected from yellow (Y),/magenta (M), cyan (C) and black (K). The functional component is cured or hardened when provided with energy under a prescribed condition thereby to decrease the transferability (or transfer characteristic) of the image forming element. The "transferability" used herein refers to a quality or degree of being transferable to a transfer-receiving medium. Further, "decrease in transferability" refers to a case wherein the image forming element becomes less transferable to the same transfer-receiving medium.

In FIG. 1 and FIG. 2 described hereinafter, an image forming element containing a yellow colorant is represented by a reference numeral 1c, an image forming element containing a magenta colorant is represented by a reference numeral 1d, image forming elements containing a cyan and black colorants are represented by reference numerals 1e and 1f, respectively. The colorants to be contained in the respective image forming elements, however, are not restricted to yellow, magenta, cyan and black, but may be colorants of any color depending on the intended use.

Further, the number of species of the colorants may be 2, 3, 5 or more. The distribution of the image forming elements is not necessarily regular but may be irregular as long as it is sufficiently uniform to some extent to provide an image having appropriate resolution and reproducibility in color.

The image forming elements 1c, 1d, 1e and 1f may be classified into two groups, i.e., a first image forming element, and a second image forming element. In the embodiment as shown in FIG. 1 and FIGS. 2A–2D, the image forming elements 1c, 1d and 1e are classified as the first group, and the image forming element 1f is classified as the second group. The first image forming element decreases its transferability when provided with light and heat energies. Each image forming element comprises a colorant and a functional component. The functional components contained in the first image forming elements have different sensitive wavelength regions depending on the species of the colorant contained therein. More specifically, the first image forming element 1c containing a yellow colorant causes abrupt crosslinking to be cured thereby to decrease its transferability when a heat flux and a light beam with a wavelength $\lambda(Y)$ are applied thereto. When a light beam with a wavelength other than $\lambda(Y)$ is applied to the image forming element 1c, the above-mentioned crosslinking does not occur. Similarly, the first image forming element 1d containing a magenta colorant, and the first image forming element 1e containing a cyan colorant causes abrupt crosslinking to be cured when a heat and a light beam with a wavelength $\lambda(M)$, heat and a light beam with a wavelength $\lambda(C)$, respectively, are applied thereto. Accordingly, in the first image forming elements, plural species of energy application conditions for apply light and heat energies are provided depending on the difference in wavelength of light energy.

On the other hand, the second image forming element causes abrupt curing to decrease its transferability under any one of at least two conditions selected from the above-mentioned plural energy application conditions for the first image forming elements. In the above embodiment, there are three species of energy application conditions for the first image forming elements depending on the difference in wavelength of light energy (i.e., $\lambda(Y)$, $\lambda(M)$ and $\lambda(C)$). The second image forming element causes abrupt curing to decrease its transferability under any one of at least two conditions selected from the above-mentioned three species of energy application conditions.

For example, when there are three species of energy application conditions for the first image forming elements depending on the difference in wavelength of light energy (i.e., $\lambda(Y)$, $\lambda(M)$ and $\lambda(C)$), the second image forming element may cause abrupt crosslinking to be cured under any one of the three species of energy application conditions, i.e., application of $\lambda(Y)$ and heat; application of $\lambda(M)$ and heat; and application of $\lambda(C)$ and heat. Alternatively, the second image forming element may be one which causes abrupt crosslinking to be cured under any one of two species of energy application conditions selected from application of $\lambda(Y)$ and heat; application of $\lambda(M)$ and heat; and application of $\lambda(C)$ and heat.

In this embodiment of the image forming method, the recording medium 1 according to the present invention is superposed on a thermal head 20, and light is supplied so as to cover the entire heat generation region of the thermal head 20. The wavelengths of the illumination light are selected sequentially so as to react on image forming elements 1c, 1d and 1e to be illuminated. For example, light beams having a wavelength $\lambda(C)$, $\lambda(M)$ and $\lambda(Y)$, respectively, are successively supplied.

Now, there is explained an embodiment wherein there is formed a recorded image comprising colors of yellow, magenta, red, blue, white and black, respectively corresponding to heating elements of 20a, 20b, 20c, 20d, 20e, and 20f.

More specifically, while the recording medium 1 is illuminated with a light beam having a wavelength $\lambda(Y)$ heating elements 20b, 20d and 20e for example, of the thermal head 20 are caused to generate heat. As a result, among the first image forming elements 1c showing a yellow color, those applied with the heat and the light beam with a wavelength $\lambda(Y)$ are cured as shown by hatching in FIG. 2A (In FIG. 2B, et seq., the cured elements are also indicated by hatching).

Figure 2A:
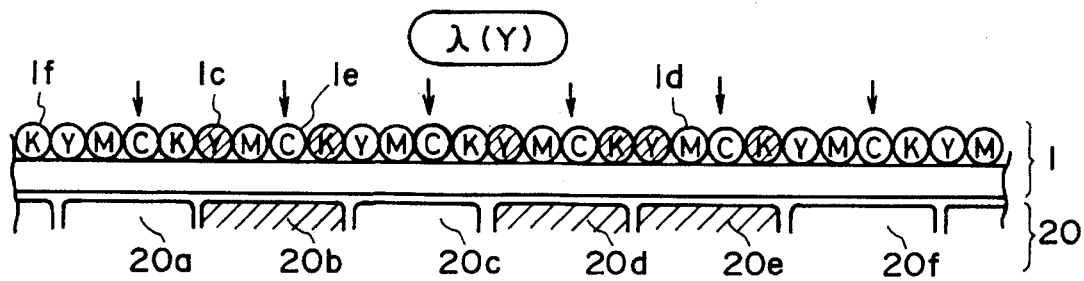
FIGS. 2A–2D are schematic partial sectional views showing a relationship between a recording medium and a thermal head involved in the image forming method according to the present invention.

Simultaneously, among the second image forming elements 1f showing a black color, those applied with the heat and the light beam with a wavelength $\lambda(Y)$ are also cured as shown in FIG. 2A.

Figure 2B:
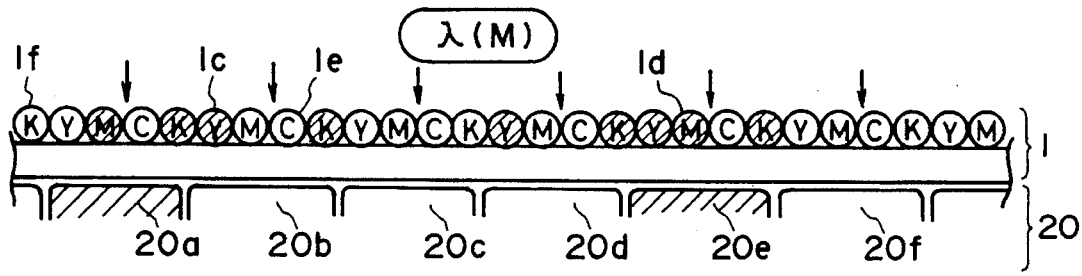

Then, as shown in FIG. 2B, while the image forming elements are illuminated with a light beam with a wavelength $\lambda(M)$, resistance heating elements 20a and 20eare caused to generate heat, whereby among the first image forming elements 1d showing a magenta color, those applied with the heat and the light beam with a wavelength $\lambda(M)$ are cured. Simultaneously, among the second image forming elements 1f showing a black color, those applied with the heat and the light beam with a wavelength $\lambda(M)$ are also cured as shown in FIG. 2B.

Figure 2C:
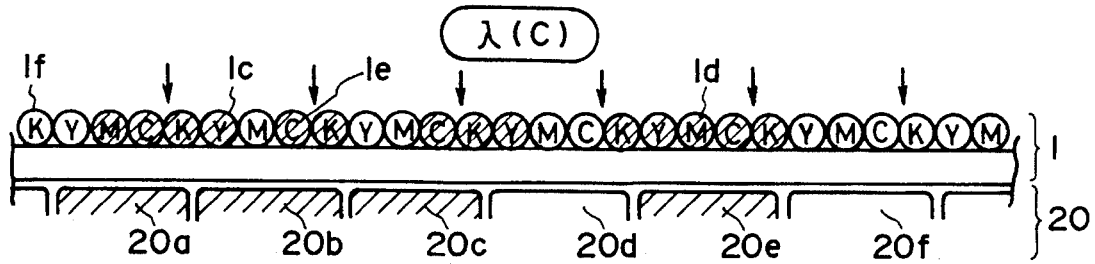
Figure 2D:
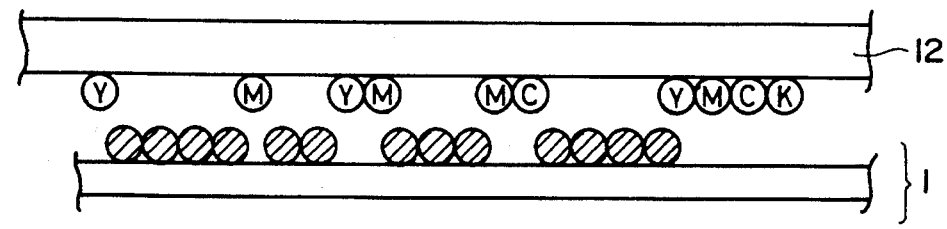

Further, as shown in FIG. 2C, while the light fluxes with wavelengths $\lambda(C)$ are provided, resistance heating elements 20a, 20c and 20e are caused to generate heat, whereby the first image forming elements 1e and the second image forming elements 1f applied with the heat and light are cured to finally leave a transferable portion or image formed of non-cured first and second image forming elements. The transferable portion is then transferred to a transfer-receiving medium (or a medium to be recorded) 12 in a subsequent transfer step as shown in FIG. 2D.

In the transfer step, the recording medium 1 on which the transferable portion has been formed is caused to contact the transfer-receiving medium 12 through the faces and heat is applied from the recording medium 1 side or the transfer-receiving medium 12 side, whereby the transferable portion is selectively transferred to the transfer-receiving medium 12 to form an image thereon. Accordingly, the heating temperature in the transfer step is so determined that the transferable portion is selectively transferred. Further, in order to effectively carry out the transfer, it is also effective to apply pressure simultaneously. The pressurization is particularly effective when a transfer-receiving medium 12 having a low surface smoothness is used. Further, in a case where the physical property controlling the transferability is a viscosity at room temperature, the pressurization alone is sufficient to effect the transfer.

The heating in the transfer step is suitable for producing a durable multi-color image with a stability and an excellent storability.

Incidentally, the color of an image forming element disposed on the recording medium 1 is not necessarily the same as that provided thereby on a transfer-receiving medium. When the former color is different from the latter color, the first image forming elements may comprise at least two species of different coloring characteristics respectively corresponding to at least two different colors to be provided on the transfer-receiving medium.

Now, there will be described the difference in functions of the first and second image forming elements, in a case where the above-mentioned difference corresponds to that in sensitive wavelength regions of the first and second image forming elements.

When the first image forming element comprises three species respectively having sensitivities to, e.g., (a) a light having a wavelength region of 300–360 nm, (b) a light having a wavelength region of 360–430 nm, and (c) a light having a wavelength region of 430 nm or above, each of the three species of the first image forming element may preferably have a sensitivity to only one wavelength region selected from the above-mentioned three wavelength regions of (a), (b) and (c).

On the other hand, the second image forming element may preferably have a sensitivity to at least two wavelength regions selected from the above-mentioned three wavelength regions of (a), (b) and (c).

In the above description, the difference in functions of the first and second image forming elements is explained with reference to light energy. However, the first or second image forming element may be one capable of initiating a reaction when provided with light and heat energies.

In the present invention, it is preferred that the second image forming element contains a black colorant. The reason for this is as follows.

When, a black recorded image is intended to be obtained by transferring image forming elements of yellow, magenta and cyan, it is sometimes difficult to obtain a recorded image having a high image density. However, when a recording medium comprising a second image forming element showing a black color is used, the black image forming element is transferred to a transfer-receiving medium under a condition such that the image forming elements of yellow, magenta and cyan are all transferred thereto. As a result, there is provided a black recorded image having a high image density. Further, in such an embodiment, only three species of energy application conditions corresponding to the wavelengths of $\lambda(Y)$, $\lambda(M)$ and $\lambda(C)$ are used, while the image forming elements comprise those showing four species of colors of yellow, magenta, cyan and black. Accordingly, the transfer of the above-mentioned four species of image forming elements to the transfer-receiving medium can be controlled by using the three species of energy application conditions.

In the above embodiment explained with reference to FIGS. 2A to 2D, the second image forming elements are cured when provided with light and heat energies. However, in an embodiment wherein light is provided so as to cover the entire heat generation region of a thermal head while the energized position of the thermal head is changed corresponding to a recording signal thereby to form a transferable image, the second image forming element may be one capable of being cured when provided with heat energy alone.

In the above-mentioned embodiment using a second image forming element of a black color, there are used three species of energy application conditions for the first image forming elements, and a second image forming element capable of decreasing its transferability under any one of these three species of energy application conditions. However, the second image forming element may be one capable of decreasing its transferability under any one of two species of conditions selected from the above three species of energy application conditions. For example, the second image forming element is may be caused to show a red color, and may be one capable of decreasing its transferability under any one of two species of energy application conditions, i.e., one for the first image forming element showing a yellow color and one for the first image forming element showing a magenta color.

In a case where such image forming elements are used, the second image forming element of red color is necessarily transferred to a transfer-receiving medium when the image forming elements of yellow and magenta colors are transferred thereto. As a result, a red recorded image having a high image density is obtained. However, in a case where a first image forming element of cyan color is used in addition to those of yellow and magenta colors, when the second image forming element is one capable of decreasing its transferability when provided with heat energy alone, such second image forming element is not applicable to the above-mentioned embodiment wherein the image density of the red image is increased. The reason for this is that the second image forming element decreases its transferability under any one of the three energy application conditions for the first image forming elements.

In the present invention, the first image forming element may comprise three species respectively containing yellow, magenta and cyan colorants, and the second image forming element may be one which contains a blue colorant and is capable of decreasing its transferability under any one of two energy application conditions under which the first image forming elements containing the magenta and cyan colorants respectively decrease their transferabilities.

Alternatively, the first image forming element may comprise three species respectively containing yellow, magenta and cyan colorants, and the second image forming element may be one which contains a green colorant and is capable of decreasing its transferability under any one of two energy application conditions under which the first image forming elements containing the yellow and cyan colorants respectively decrease their transferabilities. For example, while the first image forming elements may comprise yellow, magenta and cyan colorants, the second image forming elements may comprise one of black, red, blue or green colorants. However, other color combinations are possible provided the color of the second image forming elements is different from that of the first image forming elements.

In the above embodiment explained with reference to FIGS. 2A to 2D, the entire area of the thermal head 20 is illuminated with light while resistance heating elements of the thermal head 20 are selectively energized. On the contrary, while a certain area of the recording medium is uniformly heated, e.g., by energizing all the resistance heating elements of the thermal head 20 shown in FIG. 2A, light illumination may be effected selectively or imagewise to form a similar multi-color image. More specifically, light energy having a wavelength modulated according to a recording signal and selected depending on the color of an image forming element of which transfer characteristic is intended to be changed, is imparted along with heat energy.

combinations of n kinds are respectively contained in the image forming elements which are distributed to form a layer. Examples of such a combination include one comprising:

a photopolymerization initiator having a maximum sensitivity in a region of about 430–500 nm, such as:

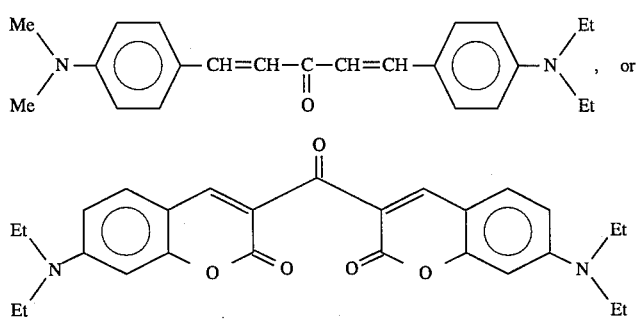

In such embodiment an, the second image forming element may be either one capable of changing its transfer characteristic when provided with light and heat energies; or one capable of changing its transfer characteristic when provided with light energy alone.

On the other hand, in an image forming method using a first image forming element which is capable of decreasing its transferability when provided with heat energy alone, it is required that the quantity of the energy applied to the recording medium in a transfer step is smaller than that of the energy applied thereto in a transferable image-forming step.

In the recording medium according to the present invention, an image forming element to be cured when provided with light and heat energies comprises, at least, a functional component and a colorant. The functional component comprises at least a photopolymerization initiator, and a monomer, oligomer or prepolymer having an unsaturated double bond. Further, the image forming element may contain an optional additive such as a binder, a thermal polymerization inhibitor, a plasticizer, or a surface-smoothing agent.

The photopolymerization initiator used in the present invention may include a carbonyl compound, a halogen compound, an azo compound, an organosulfur compound, etc. More specifically, there may be used, e.g., aromatic ketones or their derivatives such as acetophenone, benzophenone, coumarin, xanthone, thioxanthone, chalcone, and styrylstyrylketone; diketones or their derivatives such as benzil, acenaphtylenequinone and camphor-quinone; halogen compounds such as anthraquinonesulfonyl chloride, quinolinesulfonyl chloride, and 2,4,6-tris(trichloromethyl)-s-triazine; etc. The photopolymerization initiator used in the present invention, however, is not restricted to these compounds.

In order to constitute the recording medium according to the present invention, the first image forming elements are required to have sensitivities to different wavelengths depending on the colorants contained therein. More specifically, when there are a number (n) of colors of first image forming elements, the image forming elements should contain n types of photopolymerization initiators allotted to respective colors and each providing an abruptly changing reaction velocity when irradiated with a particular wavelength of light. These photopolymerization initiators in in combination with an S-triazine compound having a trihalomethyl group, a photopolymerization initiator having a maximum sensitivity in a region of about 370–400 nm, such as:

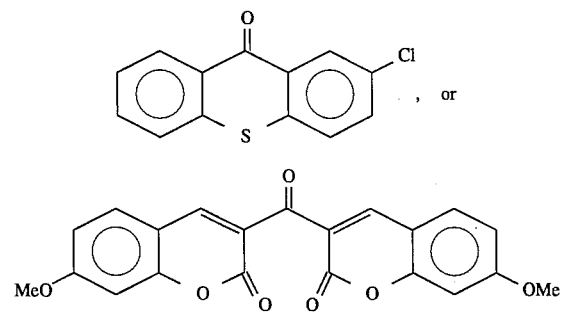

in combination with a tertiary amine compound, and a photopolymerization initiator having a maximum sensitivity in a region of about 300–350 nm, such as:

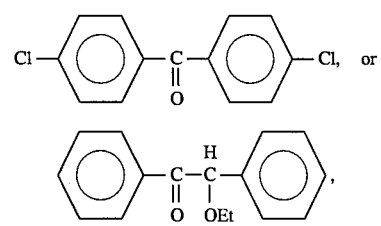

in combination with a tertiary amine compound.

Thus, the maximum sensitivities of the photopolymerization initiators are separated or differentiated from each other, whereby the first image forming elements may have sensitivities to different wavelengths. Accordingly, color separation among three colors may be provided by using the above photopolymerization initiators. Further, a full-color recording system may be developed in a similar manner.

Further, in the present invention, a compound having a large absorption in a region of ultraviolet to visible wavelengths such as an ultraviolet ray-absorbing agent, may be used in combination with the photopolymerization initiator. In such a case, the spectral characteristic of the photopolymerization initiator can be enhanced by narrowing the wavelength region to which the photopolymerization initiator has a sensitivity.

On the other hand, the second image forming element decreases its transferability under an energy application condition under which the first image forming element decreases its transferability. Because the first image forming elements have sensitivities to different wavelengths corresponding to the coloring characteristics thereof, there are plural species of energy application conditions for the first image forming elements. The second image forming element decreases its transferability under at least two species of energy application conditions selected from the above-mentioned plural species of energy application conditions for the first image forming elements. In order to decrease the transferabilities of the first and second image forming elements under the same energy application condition, the same photopolymerization initiator may be contained in both of the first and second image forming elements. Accordingly, the second image forming element may preferably contain all of the photopolymerization initiators which are contained in the first image forming elements of which transferabilities are intended to be simultaneously decreased.

For example, in the above-mentioned embodiment wherein the second image forming element shows a black color, the second image forming element contains all of the photopolymerization initiators respectively contained in the first image forming elements of yellow, magenta and cyan colors.

On the other hand, in the above-mentioned embodiment wherein the second image forming element shows a red color, the second image forming element contains all of the photopolymerization initiators respectively contained in the image forming elements of yellow, and magenta colors. In this embodiment, since the second image forming element does not contain a photopolymerization initiator which is contained in the first image forming element of cyan color, the second image forming element does not react under the energy application condition under which the cyan image forming element reacts.

The monomer, oligomer or prepolymer having an unsaturated double bond may include: urethane acrylates or urethane methacrylates synthesized by a polyaddition reaction of a polyisocyanate (optionally reacted with a polyol, as desired) with an alcohol or amine having an unsaturated double bond; epoxyacrylates synthesized by an addition reaction of an epoxy resin with acrylic acid or methacrylic acid; polyester acrylates, spiacrylates, or polyether acrylates. The monomer, oligomer or prepolymer used in the present invention, however, is not restricted to these compounds.

Further, in the present invention, there may be used a prepolymer comprising a skeleton of polyalkylene, polyether, polyester or polyurethane as a main chain, to which a polymerizing or crosslinking reactive group represented by an acrylic group, a methacrylic group, a cinnamoyl group, a cinnamylideneacetyl group, a furylacryloyl group or a cinnamic acid ester group, is introduced as a side chain. The prepolymer used in the present invention is not restricted to these compounds.

The above monomer, oligomer or prepolymer may preferably be semisolid or solid at normal or room temperature, but may also be liquid as far as it can keep itself semisolid or solid when mixed with a binder as mentioned hereinafter.

The above-mentioned monomer, oligomer or prepolymer having an unsaturated double bond, and the photopolymerization initiator may be used in combination with a binder. As the binder, there may be used any organic polymer compatible with the above monomer, oligomer or prepolymer having an unsaturated double bond.

Examples of such organic polymer may include: polyacrylic acid alkyl esters such as polymethyl acrylate and polyethyl acrylate; polymethacrylic acid alkyl esters such as polymethyl methacrylate and polyethyl methacrylate; methacrylic acid copolymers, acrylic acid copolymers, and maleic acid copolymers; chlorinated polyolefins such as chlorinated polyethylene and chlorinated polypropylene; polyvinyl chloride, polyvinylidene chloride, polyacrylonitrile, or copolymers comprising monomers constituting these polymers; polyvinyl alkyl ethers, polyethylene, polypropylene, polystyrene, polyamide, polyurethane, chlorinated rubber, cellulose derivatives polyvinyl alcohol, and polyvinyl pyrrolidone. The binder used in the present invention is not restricted to these compounds. These binders may be used singly or as a mixture of two or more species in an appropriate proportion. Further, waxes may be used as the binder without considering the compatibility or incompatibility thereof.

The coloring component or colorant is a component to provide an optically recognizable image and may be appropriately selected from various pigments and dyes. Specific examples of the colorant include: inorganic pigments such as carbon black, lead yellow, molybdenum red, and red iron oxide; organic pigments such as Hansa Yellow, Benzidine Yellow, Brilliant Carmine 6B, Lake Red C, Permanent Red F5R, Phthalocyanine Blue, Victoria Blue Lake, and Fast Sky Blue; leuco dyes, and phthalocyanine dyes.

Each image forming element may preferably comprise, based on the weight thereof, 10–99 wt. % (more preferably 50–90 wt. %) of a monomer, oligomer or prepolymer having an unsaturated double bond; 0.1–20 wt. % (more preferably 0.1–15 wt. %) of a photopolymerization initiator; 0.1–30 wt. % (more preferably 1–25 wt. %) of a colorant; and 0–90 wt. % (more preferably 0–40 wt. %) of a binder.

Each one of the second image forming elements may preferably contain at least two species of photopolymerization initiators having different sensitive wavelength regions selected from those contained in first image forming elements. Accordingly, the weight proportion of the photopolymerization initiator contained in the second image forming element may preferably be 1.3–2.5 times that of the photopolymerization initiator contained in the first image forming element, in a case where the second image forming element reacts under any on of two species of energy application conditions for the first image forming elements.

On the other hand, in a case where the second image forming element reacts under any one of three species of energy application conditions for the first image forming elements, the weight proportion of the photopolymerization initiator contained in the second image forming element may preferably be 2.3–3.5 times that of the photopolymerization initiator contained in the first image forming element.

Further, in the present invention, the image forming element may further comprise an optional additive such as a thermal polymerization inhibitor or a plasticizer.

In the recording medium of the present invention, it is possible that the radical reactivity of the image forming element is suppressed because of oxygen in the air. In order to obviate this difficulty, it is preferred to provide an oxygen-shielding layer, e.g., by applying an aqueous polyvinyl alcohol solution containing a small amount of a surfactant onto the image forming elements. The oxygen-shielding layer may be removed after the transferable image formation by washing with water. In case of image forming elements in the form of microcapsules, it is possible to have the walls show a function of the oxygen-shielding layer.

In an embodiment wherein the second image forming element decreases its transferability when provided with heat energy alone, the above-mentioned components described with respect to the image forming element which decreases its transferability when provided with light and heat energies may be used except that a thermal polymerization initiator is used in the image forming element instead of the photopolymerization initiator.

Specific examples of the thermal polymerization initiator include: peroxides such as dialkyl or diacyl peroxides, hydroperoxides, ketone peroxides and acetyl peroxides; sulfur-containing compounds such as monosulfide and sulfinic acid; azo compounds such as $\alpha,\alpha'$-azobisisobutyronitrile, triphenylmethylazobenzene, and p-bromobenzene azohydroxide; etc.

In the above-mentioned image forming method of the present invention, a transferable image is formed by using light and heat energies in a transferable image-formation step. The transferable image may be formed by using light energy alone without using heat energy. In this case, the recording medium used therein is one capable of decreasing its transferability when provided with light energy alone. When only light energy is used in the transferable image-formation step, light energy of the wavelength which is modulated or selected corresponding to the color tone of the first image forming element may be provided imagewise or while changing the irradiation position according to recording information. Such illumination may be effected in the same manner as in the above-mentioned embodiment using light and heat energies.

In this case, heat is not applied to the recording medium but only light energy is applied thereto in the transferable image formation step. Therefore, in view of the reaction velocity, it is preferred that microcapsules are used as the image forming elements and the above-mentioned monomer, oligomer or prepolymer, photopolymerization initiator or colorant is contained in the core portions of the microcapsules. The monomer, oligomer or prepolymer having an unsaturated double bond may preferably be liquid in such embodiment.

Specific examples of the liquid monomer, oligomer or prepolymer having an unsaturated double bond include: di- and polyester acrylates or methacrylates such as diethyleneglycol diacrylate, 1,6-hexanediol diacrylate, 2,2-bis(4-(acryloxy-polyethoxy)phenyl) propane, dipentaerythritol hexaacrylate, and neopentyl glycol dimethacrylate. Further, urethane acrylates and epoxyacrylates in the form of a liquid may also be used.

With respect to the materials other than the monomer, oligomer or prepolymer having an unsaturated double bond, i.e., photopolymerization initiator colorant or another optional additive such as a binder, a thermal polymerization inhibitor, a plasticizer, or a surface-smoothing agent, those used in the above-mentioned embodiment wherein a transferable image is formed by using light and heat energies may be used as such. Incidentally, in the embodiment wherein a transferable image is formed by using light and heat energies, the monomer, oligomer or prepolymer having an unsaturated double bond may preferably be solid.

In the present invention, the embodiment wherein a transferable image is formed by using light and heat energies is preferred as compared with that using light energy alone, in view of the stability to environmental conditions.

The recording medium of the present invention may be obtained by melt-mixing the components constituting the image forming elements, forming the resultant mixture into minute image forming elements by spray-drying, emulsification-granulation, etc., and applying the image forming elements onto a substrate. Further, in order to prevent a decrease in sensitivity or to enhance the resolution of an image, image forming elements in the form of microcapsules may preferably be used.

More specifically, when image forming elements are in the form of microcapsules, the above-mentioned compositions for the image forming elements are contained as cores and encapsulated by a wall. On the other hand, the wall of the microcapsules may for example be formed of a material including gelatine, gum arabic, cellulosic resins such as ethyl cellulose, and nitrocellulose, polymers such as urea-formaldehyde resin, polyamides, polyesters, polyurethane, polycarbonate, maleic anhydride copolymers, polyvinylidene chloride, polyvinyl chloride, polyethylene, polystyrene, and polyethylene terephthalate (PET).

The distributed layer of image forming elements may preferably be formed in a thickness of 1–30 μ, particularly 1–15 μ. When the image forming elements are in the form of microcapsules, it is preferred that the microcapsules have a number-average particle size of 1–20 μ, particularly 3–10 μ. The image forming elements may preferably have a particle size distribution in the range of within ±50%, particularly within ±20%, from the number-average particle size thereof. The wall thickness of the microcapsules may preferably be 0.1–2.0 μ, particularly 0.1–0.5 μ.

Microencapsulation may be effected in any of the known methods, such as simple coacervation, complex coacervation, interfacial polymerization, in-situ polymerization, interfacial precipitation, phase separation, spray drying, gaseous-phase suspension coating, and mechano-chemical process.

The substrate or support to be used in the recording medium according to the present invention may be polyester, polycarbonate, triacetylcellulose, nylon, polyimide, polyethylene terephthalate, or metal such as aluminum, etc. The form of the substrate may be a film or sheet, plate, drum, or sphere, depending on an intended use. The substrate in the form of a film may preferably have a thickness of about 1–100 μm, more preferably about 3–20 μm.

In order to form a distributed layer of image forming elements, there may be used, e.g., a method wherein image forming elements are mixed with an adhesive such as polyvinyl alcohol (PVA), polyacrylamide and latex, and the resultant mixture is applied onto a substrate; and a method wherein an adhesive such as epoxy adhesive urethane adhesive, acrylic adhesive, polyester adhesive and ethylene-vinyl acetate copolymer is applied onto a substrate and image forming elements are distributed or sprinkled on the resultant adhesive coating to be bonded to the substrate.

Hereinbelow, the present invention will be described by way of examples.

TABLE 1

Example 1

| Item | Component | wt. % |
|---|---|---|
| Polymerizable monomer | $CH_2=CH-\underset{\underset{O}{\|}}{C}-O-CH_2-\underset{\underset{CH_3}{\|}}{CH}-O-\underset{\underset{O}{\|}}{C}-NH-\langle H \rangle-$ $-NH-\underset{\underset{O}{\|}}{C}-O-\underset{\underset{CH_3}{\|}}{CH}-CH_2-O-\underset{\underset{O}{\|}}{C}-CH=CH_2$ | 65 |
| Photopolymerization initiator | 4,4'-Dimethoxybenzil/ Ethyl p-dimethylaminobenzoate | 5.2/0.4 |
| Binder | Polymethyl methacrylate (Elvasite 2041, mfd. by Du Pont) | 23.4 |
| Colorant | PV Fast Pink E-01 (mfd. by Hoechst) | 6 |

TABLE 2

| Item | Component | wt. % |
|---|---|---|
| Polymerizable monomer | $CH_2=CH-\underset{\underset{O}{\|}}{C}-O-CH_2-\underset{\underset{CH_3}{\|}}{CH}-O-\underset{\underset{O}{\|}}{C}-NH-\langle H \rangle-$ $-NH-\underset{\underset{O}{\|}}{C}-\underset{\underset{CH_3}{\|}}{C}-CH-CH_2-O-\underset{\underset{O}{\|}}{C}-CH=CH_2$ | 65 |
| Photopolymerization initiator | 2-Chlorothioxanthone/ Ethyl p-dimethylaminobenzoate | 5.2/1.3 |
| Binder | Polymethyl methacrylate (Elvasite 2041, mfd. by Du Pont) | 22.5 |
| Colorant | Cyanine Blue 3472 (mfd. by Dainichi Seika K.K.) | 6 |

TABLE 3

| Item | Component | wt. % |
|---|---|---|
| Polymerizable monomer | $CH_2=CH-\underset{\underset{O}{\|}}{C}-O-CH_2-\underset{\underset{CH_3}{\|}}{CH}-O-\underset{\underset{O}{\|}}{C}-NH-\langle H \rangle-$ $-NH-\underset{\underset{O}{\|}}{C}-O-\underset{\underset{CH_3}{\|}}{CH}-CH_2-O-\underset{\underset{O}{\|}}{C}-CH=CH_2$ | 71 |
| Photopolymerization initiator | 3,3'-Carbonylbis(7-diethyamino-coumarin) | 1.4 |
| | Camphorquinone | 1.4 |
| | Ethyl p-dimethylaminobenzoate | 1.4 |
| Binder | Polymethyl methacrylate (Elvasite 2041, mfd. by Du Pont) | 24.3 |
| Colorant | PV Fast Yellow HG (mfd. by Hoechst) | 0.5 |

TABLE 4

| Item | Component | wt. % |
| --- | --- | --- |
| Polymerizable monomer | $CH_2=CH-\underset{O}{\underset{\|}{C}}-O-CH_2-CH_2-O-\underset{O}{\underset{\|}{C}}-NH-CH_2-\langle H \rangle-$ $-CH_2-NH-\underset{O}{\underset{\|}{C}}-O-CH_2-CH_2-O-\underset{O}{\underset{\|}{C}}-CH=CH_2$ | 57 |
| Photopolymerization initiator | 4,4'-Dimethoxybenzil | 4.5 |
| | 2-Chlorothioxanthone | 4.5 |
| | Ethyl p-dimethylaminobenzoate | 1.1 |
| | 3,3'-Carbonylbis(7-diethyaminocoumarin) | 1.1 |
| | Camphorquinone | 1.1 |
| Binder | Polymethyl methacrylate (Elvasite 2041, mfd. by Du Pont) | 19.5 |
| Colorant | PV Fast Pink E-01 (mfd. by Hoechst) | 5.4 |
| | Cyanine Blue 3472 (mfd. by Dainichi Seika) | 5.4 |
| | PV Fast Yellow HG (mfd. by Hoechst) | 0.4 |

Image forming elements in a microcapsular form were prepared in the following manner.

10 g of a mixture of components shown in Table 1 was mixed with 20 g of methylene chloride. The resultant mixture was further mixed with a solution obtained by dissolving a few drops of nonionic surfactant having an HLB of 13 (Nonipole 100, mfd. by Sanyo Kasei Kogyo K.K.) and 1 g of gelatin in 200 ml of water, and the mixture was further emulsified by means of a homomixer at 8000–10000 rpm, on heating at 60° C., thereby to obtain oil droplets having an average particle size of 26 μ. The mixture was further stirred for 30 min. at 60° C., and then the methylene chloride was distilled off thereby to obtain oil droplets having an average particle size of 10 μ.

Then, a solution obtained by dissolving 1 g of gum arabic in 20 ml of water was added to the above prepared mixture. An $NH_4OH$ (aqueous ammonia solution) was added to the resultant mixture, while cooled slowly, to adjust the pH to 11 or higher, whereby a microcapsule slurry was prepared. Thereafter, 1.0 ml of a 20% aqueous glutaraldehyde solution was slowly added to the slurry thereby to harden the microcapsule walls.

The slurry was subjected to solid-liquid separation by means of a Nutsche funnel, and the solid was dried at 35° C. for 10 hours in a vacuum drier to obtain microcapsular image forming elements.

The above procedure was repeated except that mixtures of components shown in Table 2, 3 and 4 were used instead of that shown in Table 1, respectively.

The thus obtained four species of the image forming elements were microcapsules having a particle size of about 8–12 μm.

Figure 3:
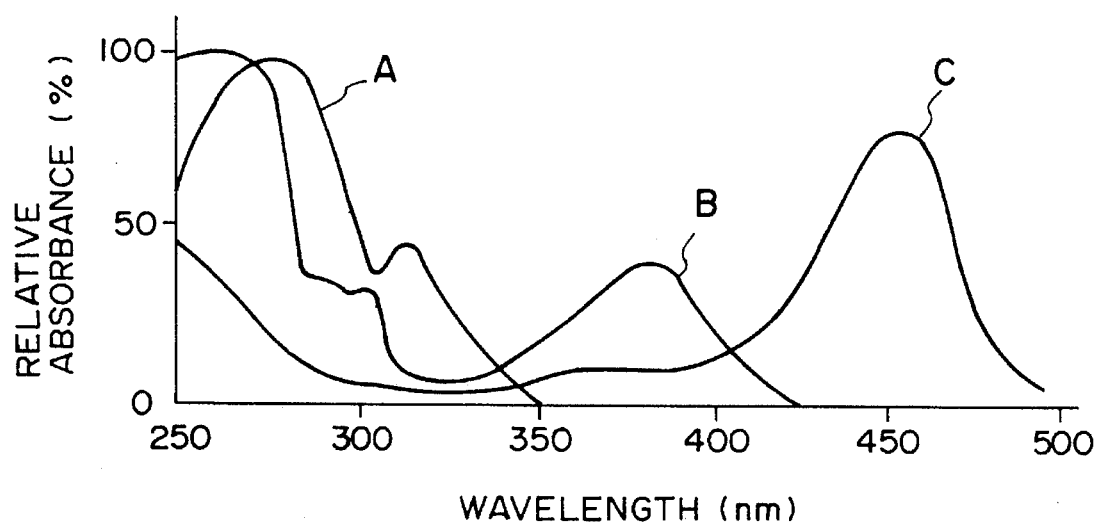
FIG. 3 is a graph showing an absorption characteristic of a photopolymerization initiator used in the recording medium of the present invention.

The photopolymerization initiator shown in Table 1 had a property of initiating a reaction when it absorbed light having a wavelength region corresponding to a graph A shown in FIG. 3. The photopolymerization initiator shown in Table 2 or 3 had a property of initiating a reaction when it absorbed light having a wavelength region corresponding to a graph B or C shown in FIG. 3, respectively. Further, the photopolymerization initiator shown in table 4 had a property of initiating a reaction when it absorbed light having a wavelength region corresponding to any one of the graphs A, B and C. The above-mentioned four species of image forming elements had colors of magenta, cyan, yellow and black, respectively.

By using a mixture obtained by mixing equal amounts of the thus prepared four species of image forming elements, a recording medium according to the present invention was prepared in the following manner.

First, a solution of a polyester adhesive (Polyester LP-220, mfd. by Nihon Gosei Kagaku Kogyo K.K.) in toluene was applied onto a substrate of a PET film having a thickness of 6 μm, and then dried thereby to form an adhesive layer having a thickness of about 1 μm. The PET film side of the thus coated film was caused to closely contact a hot plate heated up to about 110° C., and an excess amount of the above-mentioned mixture comprising the four species of image forming elements was sprinkled on the adhesive layer, and thereafter the PET film was peeled from the hot plate. Then, image forming elements not contacting the adhesive were removed by means of an air gun, and thereafter the PET film on which the image forming elements were disposed was passed between two rollers contacting under a pressure of 1 Kgf/cm². The surface temperature of the roller was kept at 110° C.

Figure 4:
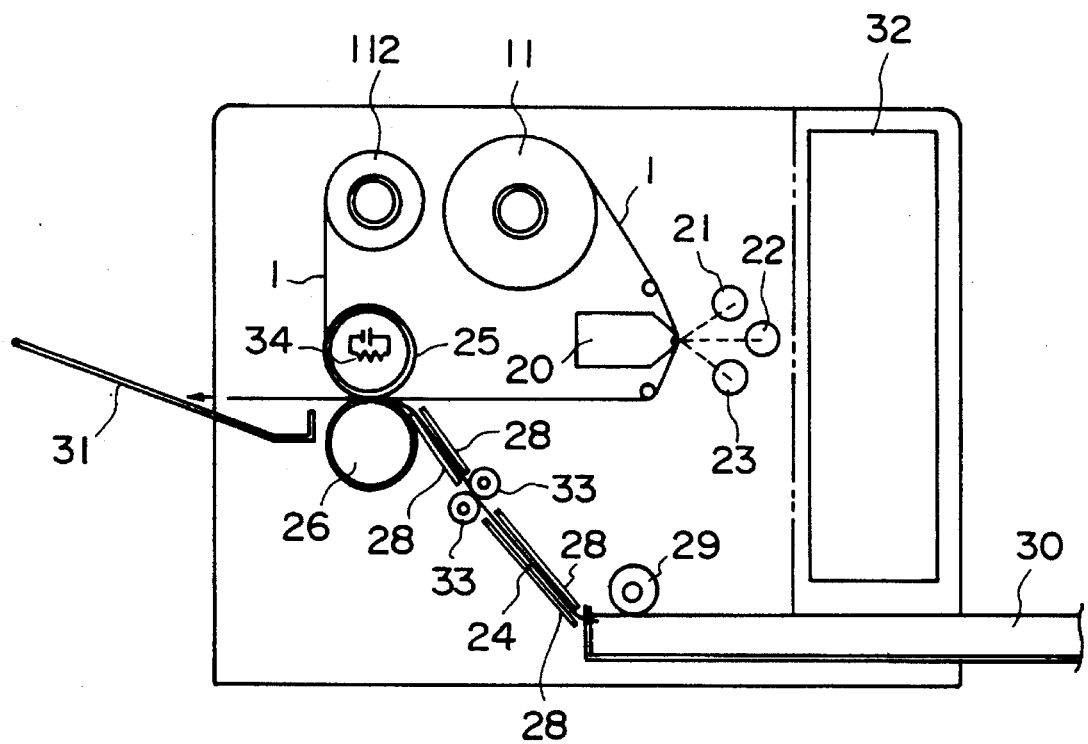
FIG. 4 is a schematic sectional view showing an example of a system arrangement for practicing the image forming method according to the present invention.

The thus obtained recording medium was wound up in a roll and set in an apparatus as shown in FIG. 4 so that the PET film side of the recording medium 1 contacted a thermal head 20.

In this instance, the light source included a 20W-health ray fluorescent lamp 21 (FL20SE, mfd. by Toshiba K.K.) having a peak wavelength of 335 nm, a 20W-fluorescent lamp 22 having a peak wavelength of 390 nm (FL10A70E, mfd. by Toshiba K.K.), and a 20W-fluorescent lamp 23 having a peak wavelength of 450 nm (FL10A70B). When the thermal head 20 was energized, a current pulse corresponding to 0.5 W/dot was applied thereto at a duty of 33.3% for 20 m sec.

In FIG. 4, reference numeral 11 denotes a supplying roll for supplying the transfer recording medium 1, numeral 112 denotes a winding roll for winding up the transfer recording medium 1, numeral 24 denotes a recording paper (plain paper), numeral 30 denotes a cassette for the recording paper, numeral 25 denotes a transfer roller, numeral 26 denotes a pressure roller. Further, numeral 32 denotes a control unit for controlling and driving the apparatus shown in FIG. 4.

By using the above-mentioned apparatus, image formation was effected in the following manner.

Figure 5:
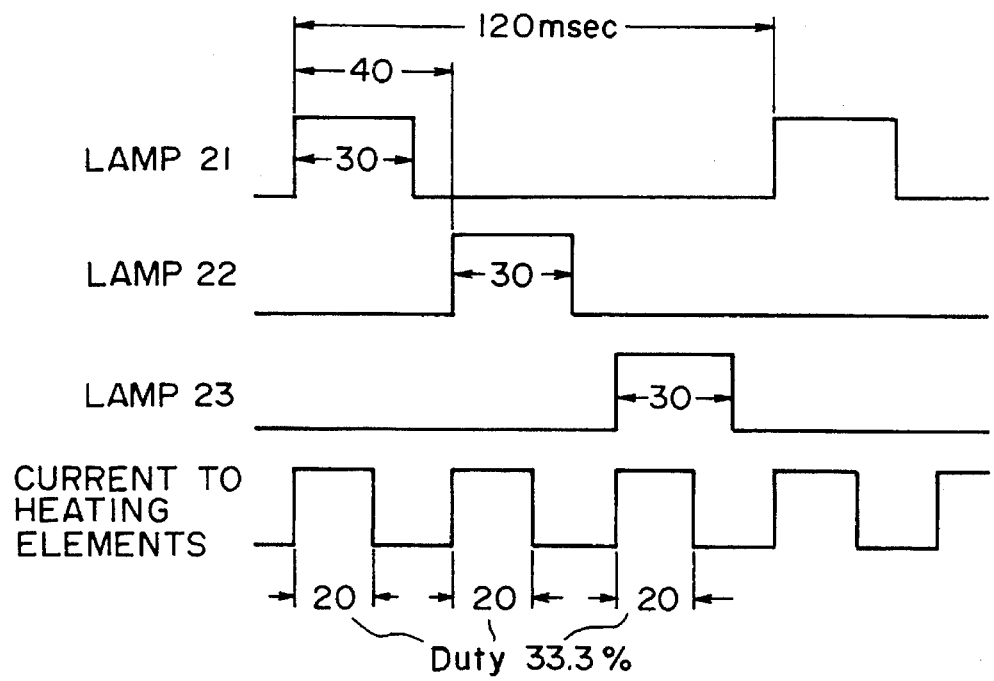
FIGS. 5 and 6 are respectively a timing chart for driving the heat and light energy sources used in an embodiment of the image forming method according to the present invention.

FIG. 5 shows a driving timing chart for this instance.

First, a current was supplied for 30 m sec to the thermal head 20 corresponding to an image signal of "cyan" while the fluorescent lamp 21 was simultaneously turned on to effect uniform illumination. The illumination time was 30 m sec as shown in FIG. 5. After 10 m sec from the termination of the illumination, a current was supplied to the thermal head 20 corresponding to an image signal of "magenta", while the fluorescent lamp 22 was simultaneously turned on to effect uniform illumination. The energization time and the illumination time were the same as in the case of the "cyan" signal. Such energization and illumination were effected corresponding to a "yellow" signal in the same manner as described above.

In the above described manner, the thermal head 20 was energized under control based on image signals of cyan, magenta and yellow, while the recording medium 1 was conveyed by the transfer roller 25 and a stepping motor (not shown) in synchronism with the operation in a repetition cycle of 120 m sec/line. After a transferable image was formed in this way, a recording paper 24 of plain paper which had been supplied, from the recording paper cassette 30 by means of a paper-supplying roller 29 and a pair of conveying rollers 33, was superposed onto the transferable image-bearing face of the recording medium 1. The resultant laminate was conveyed to a contact position where the transfer roller 25 and the pressure roller 26 were disposed opposite to each other. The transfer roller 25 was an aluminum roller of which surface temperature was controlled at 120° C. by means of a heater 34 disposed inside thereof. Further, the pressure roller 26 was an aluminum roller covered with a silicone rubber. The transfer roller 25 and the pressure roller 26 were controlled to exert a pressure of 25 $Kgf/cm_2$.

When the laminate of the recording medium 1 and the recording paper 24 was passed through these rollers 25 and 26, a multi-color transferable image formed on the recording medium 1 was transferred to the recording paper 24, and the resultant recording paper 24 was discharged into a discharge tray 31.

The thus obtained multi-color image on the recording paper 24 was free of color deviation, had a high degree of saturation and clearness, and was a good quality of image with a good fixation characteristic.

TABLE 5

Example 2

| Item | Component | wt. % |
|---|---|---|
| Polymerizable monomer | $CH_2=CH-\underset{O}{\underset{\|}{C}}-O-CH_2-CH_2-O-\underset{O}{\underset{\|}{C}}-NH-CH_2-\langle H \rangle-$ $-CH_2-NH-\underset{O}{\underset{\|}{C}}-O-CH_2-CH_2-O-\underset{O}{\underset{\|}{C}}-CH=CH_2$ | 65 |
| Photopolymerization initiator | 4,4'-Dimethoxybenzil/ Ethyl p-dimethylaminobenzoate | 5.2/0.4 |
| Binder | Polymethyl methacrylate (Elvasite 2041, mfd. by Du Pont) | 23.4 |
| Colorant | PV Fast Pink E-01 (mfd. by Hoechst) | 6 |

TABLE 6

| Item | Component | wt. % |
|---|---|---|
| Polymerizable monomer | $CH_2=CH-\underset{O}{\underset{\|}{C}}-O-CH_2-CH_2-O-\underset{O}{\underset{\|}{C}}-NH-CH_2-\langle H \rangle-$ $-CH_2-NH-\underset{O}{\underset{\|}{C}}-O-CH_2-CH_2-O-\underset{O}{\underset{\|}{C}}-CH=CH_2$ | 65 |
| Photopolymerization initiator | 2-Chlorothioxanthone/ Ethyl p-dimethylaminobenzoate | 5.2/1.3 |
| Binder | Polymethyl methacrylate (Elvasite 2041, mfd. by Du Pont) | 22.5 |
| Colorant | Cyanine Blue 3472 (mfd. by Dainichi Seika K.K.) | 6 |

TABLE 7

| Item | Component | wt. % |
|---|---|---|
| Polymerizable monomer | $CH_2=CH-\underset{\underset{O}{\|\|}}{C}-O-CH_2-CH_2-O-\underset{\underset{O}{\|\|}}{C}-NH-CH_2-\langle H \rangle-$ $-CH_2-NH-\underset{\underset{O}{\|\|}}{C}-O-CH_2-CH_2-O-\underset{\underset{O}{\|\|}}{C}-CH=CH_2$ | 71 |
| Photopolymerization initiator | 3,3'-Carbonylbis(7-diethyaminocoumarin) | 1.4 |
| | Camphorquinone | 1.4 |
| | Ethyl p-dimethylaminobenzoate | 1.4 |
| Binder | Polymethyl methacrylate (Elvasite 2041, mfd. by Du Pont) | 24.3 |
| Colorant | PV Fast Yellow HG (mfd. by Hoechst) | 0.5 |

TABLE 8

Example 2

| Item | Component | wt. % |
|---|---|---|
| Polymerizable monomer | $CH_2=CH-\underset{\underset{O}{\|\|}}{C}-O-CH_2-CH_2-O-\underset{\underset{O}{\|\|}}{C}-NH-CH_2-\langle H \rangle-$ $-CH_2-NH-\underset{\underset{O}{\|\|}}{C}-O-CH_2-CH_2-O-\underset{\underset{O}{\|\|}}{C}-CH=CH_2$ | 68 |
| Photopolymerization initiator | Di-t-butyl peroxide | 3 |
| Binder | (Chlorination degree: 25%) Chlorinated polyethylene | 17 |
| Colorant | Magnetite | 12 |

Mixtures of components as shown in Tables 5, 6, 7 and 8 were respectively microencapsulated in the same manner as in Example 1 thereby to obtain four species of image forming elements in the form of microcapsules.

By using a mixture obtained by mixing equal amounts of the thus prepared four species of image forming elements, a recording medium was prepared in the following manner.

First, a solution of a polyester adhesive (Polyester LP-022, mfd. by Nihon Gosei Kagaku Kogyo K.K.) in toluene was applied onto a substrate of a PET film having a thickness of 6 μm, and then dried thereby to form an adhesive layer having a thickness of about 1 μm. An excess amount of the above-mentioned mixture comprising the four species of image forming elements was sprinkled on the adhesive layer, and image forming elements not contacting the adhesive were removed by means of an air gun, and thereafter the PET film on which the image forming elements were disposed was passed between two rollers contacting under a pressure of 1 Kgf/cm². The surface temperature of the roller was kept at 50° C.

The thus obtained recording medium was wound up in a roll and set in an apparatus as shown in FIG. 4, and image formation was effected in the same manner as in Example 1 except that the surface temperature of the transfer roller 25 was controlled at 80° C.

The thus obtained multi-color image on the recording paper was free of color deviation had a high degree of saturation and clearness, and was a good quality of image, similarly as in Example 1.

TABLE 9

Example 3

| Item | Component | wt. % |
|---|---|---|
| Polymerizable monomer | $CH_2=CH-\underset{\underset{O}{\|}}{C}-O-CH_2-CH_2-O-\underset{\underset{O}{\|}}{C}-NH-CH_2-\bigcirc\!\!-H-$ $-CH_2-NH-\underset{\underset{O}{\|}}{C}-O-CH_2-CH_2-O-\underset{\underset{O}{\|}}{C}-CH=CH_2$ | 66 |
| Photopolymerization initiator | 2-Chlorothioxanthone/ Ethyl p-dimethylaminobenzoate | 5.2/1.3 |
| Binder | Polymethyl methacrylate (Elvasite 2041, mfd. by Du Pont) | 21.5 |
| Colorant | Heliogen Red L3880 HD (mfd. by BASF) | 6 |

TABLE 10

| Item | Component | wt. % |
|---|---|---|
| Polymerizable monomer | $CH_2=CH-\underset{\underset{O}{\|}}{C}-O-CH_2-CH_2-O-\underset{\underset{O}{\|}}{C}-NH-CH_2-\bigcirc\!\!-H-$ $-CH_2-NH-\underset{\underset{O}{\|}}{C}-O-CH_2-CH_2-O-\underset{\underset{O}{\|}}{C}-CH=CH_2$ | 65 |
| Photopolymerization initiator | 2-Chlorothioxanthone | 5.1 |
| | 3',3'-Carbonylbis(7-diethyaminocoumarin) | 1.3 |
| | Camphorquinone | 1.3 |
| | Ethyl p-dimethylaminobenzoate | 1.3 |
| Binder | Polymethyl methacrylate (Elvasite 2041, mfd. by Du Pont) | 22 |
| Colorant | Cyanine Blue 3472 (mfd. by Dainichi Seika K.K.) | 6 |

The components as shown in Tables 7, 9 and 10 were respectively microencapsulated in the same manner as in Example 2 thereby to obtain three species of image forming elements in the form of microcapsules.

By using a mixture obtained by mixing equal amounts of the thus prepared three species of image forming elements, a recording medium was prepared in the same manner as in Example 2.

Figure 6:
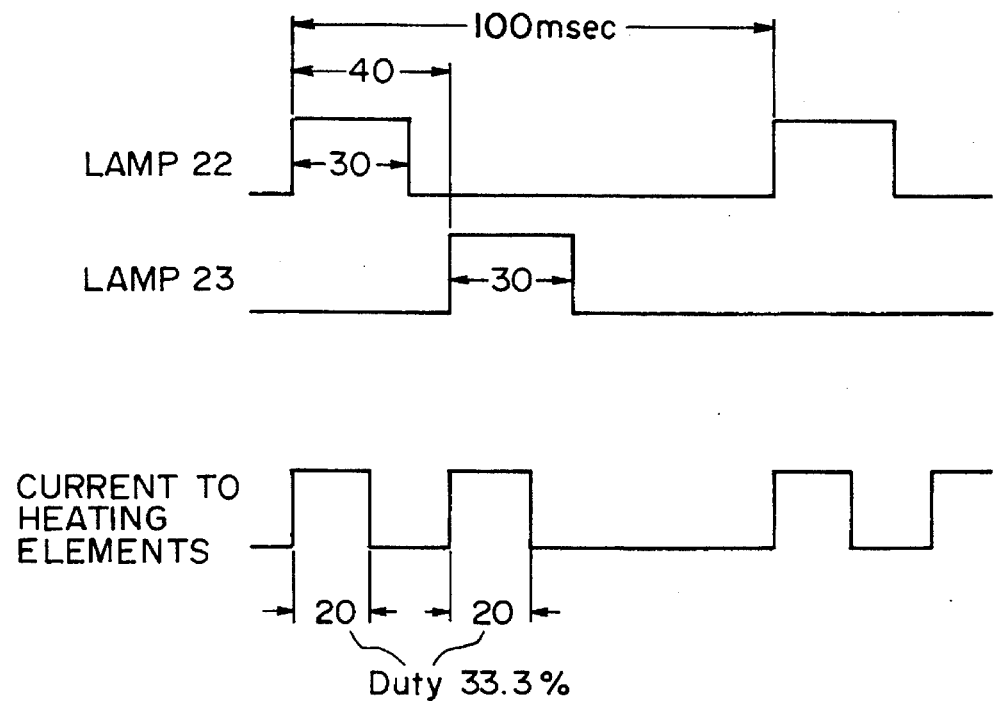

The thus obtained recording medium was wound up in a roll and set in an apparatus as shown in FIG. 4, and image formation was effected in the same manner as in Example 2 except that the energy sources are driven according to a timing chart shown in FIG. 6. As a result, there was obtained a clear image free of color deviation comprising yellow, red and black colors.

TABLE 11

Example 4

| Item | Component | wt. % |
|---|---|---|
| Polymerizable monomer | Trimethylolpropane triacrylate | 83 |
| Photopolymerization initiator | 4,4'-Dimethoxybenzil/ Ethyl p-dimethylaminobenzoate | 8.6/1.4 |
| Colorant | PV Fast Pink E-01 (mfd. by Hoechst) | 7 |

TABLE 12

| Item | Component | wt. % |
|---|---|---|
| Polymerizable monomer | Trimethylolpropane triacrylate | 83 |
| Photopolymerization initiator | 2-Chlorothioxanthone/ Ethyl p-dimethylaminobenzoate | 7/3 |
| Colorant | Cyanine Blue 3472 (mfd. by Dainichi Seika K.K.) | 7 |

TABLE 13

| Item | Component | wt. % |
| --- | --- | --- |
| Polymerizable monomer | Trimethylolpropane triacrylate | 93 |
| Photopolymerization initiator | 3,3'-Carbonylbis(7-diethyamino-coumarin) | 2 |
| | Camphorquinone | 2 |
| | Ethyl p-dimethylaminobenzoate | 2 |
| Colorant | PV Fast Yellow HG (mfd. by Hoechst) | 0.5 |

TABLE 14

| Item | Component | wt. % |
| --- | --- | --- |
| Polymerizable monomer | Trimethylolpropane triacrylate | 71 |
| Photopolymerization initiator | 4,4'-Dimethoxybenzil | 5.5 |
| | 2-Chlorothioxanthone | 4 |
| | 3,3'-Carbonylbis(7-diethylamino-coumarin) | 2 |
| | Ethyl p-dimethylaminobenzoate | 2.5 |
| | Camphorquinone | 2 |
| Colorant | PV Fast Pink E-01 (mfd. by Hoechst) | 6 |
| | Cyanine Blue 3472 | 6 |
| | PV Fast Yellow HG | 1 |

The components as shown in Tables 11, 12, 13 and 14 were respectively microencapsulated corresponding to respective colors in the same manner as in Example 1 thereby to obtain four species of image forming elements in the form of microcapsules. Each species of the resultant microcapsules had a particle size of about 8–12 μm.

A mixture obtained by mixing equal amounts of the thus prepared four species of image forming elements, was bonded to a 6 μm-thick PET film in the same manner as in Example 1, thereby to prepare a recording medium according to the present invention.

Separately, an original image was subjected to color separation to be separated into yellow (Y), magenta (M) and cyan (C) colors thereby to obtain three species (Y, M and C) of positive photographic transparencies.

First, the positive photographic transparency (Y) was superposed on the above-mentioned recording medium, and further a cover plate of glass was superposed on the transparency. Then, a 20W-fluorescent lamp having a peak wavelength of 450 nm (FL10A70B, mfd. by Toshiba K.K.) was disposed above the cover plate, and exposure was effected for 10 sec.

Then, a positive photographic transparency (M) and a cover plate were disposed on the recording medium in the same manner as in the case of the transparency (Y), and the recording medium was exposed for 13 sec. by means of a 20W-fluorescent lamp having a peak wavelength of 335 nm (FL20SE, mfd. by Toshiba K.K.).

Further, a positive photographic transparency (C) and a cover plate were disposed on the recording medium in the same manner as in the case of the transparency (Y), and the recording medium was exposed for 11 sec. by means of a 20W-fluorescent lamp (FL 10A70E, mfd. by Toshiba K.K.), thereby to form a transferable image on the recording medium.

Then, the recording medium on which the transferable image had been formed in this manner was superposed on a recording paper, and the resultant laminate was passed through a transfer roller 25 and a pressure roller 26 as shown in FIG. 4, thereby to transfer the transferable image onto the recording paper. The contact pressure exerted by the transfer roller 25 and the pressure roller 26 was set to 100 Kgf/cm$^2$, and the surface temperature of the transfer roller was set to 120° C.

The thus obtained recorded image had a high quality similarly as in Example 1.

As described hereinabove, by using the image forming method or recording medium according to the present invention, the number of species of photopolymerization initiators, may be smaller than that of colors in a case where a multi-color recording is is effected by changing the wavelength of light to be imparted to the recording medium. As a result, there is obtained a recorded image of high quality improved with respect to crosstalk.

Further, according to the conventional recording method, when $n$ species of colorants are used, the application of energy must be repeated $n$ times in one cycle, while using different energy application conditions, e.g., by using light energies having different wavelengths. Accordingly, in the conventional method, the number of energy applications effected in one cycle is equal to that of the species of colorants used therein.

On the contrary, according to the present invention, the number of energy applications effected in one cycle is smaller than that of the species of colorants used therein, whereby a high-speed recording may be effected.

What is claimed is:

1. An image forming method, comprising the steps of:

providing a recording medium comprising a substrate and a distributed layer disposed thereon, said distributed layer comprising a plurality of first particulate image forming elements and a plurality of second particulate image forming elements;

said first image forming elements comprising at least two species of material having different coloring characteristics, said at least two species of material decreasing their transferabilities under at least two energy application conditions, each said species of material decreasing its transferability under a particular and corresponding energy application condition which involves the application of light energy and heat energy, each said energy application condition being associated with a particular said species of material;

said second image forming elements being capable of decreasing their transferability under any one of said at least two energy application conditions, said first and second image forming elements being capable of being hardened to decrease their transferabilities, said second image forming elements having a coloring characteristic which is different from that of said first image forming elements;

imparting light energy and heat energy to the recording medium in accordance with a recording information signal to selectively obtain said energy application condition to decrease the transferability of said first image forming elements so that the transferability of said second image forming elements is decreased along with decrease of transferability of the first image forming elements of at least one coloring characteristic, whereby a transferable image pattern is formed in said distributed layer; and transferring the transferable image pattern of the distributed layer to a transfer-receiving medium, thereby forming an image corresponding to the transferable image pattern of the transfer-receiving medium.

2. A method according to claim 1, wherein said first image forming elements comprise three species respectively containing yellow, magenta and cyan colorants, and said second image forming element contains a black colorant and is capable of decreasing its transferability under any one of the three energy application conditions under which said three species of first image forming elements respectively decrease their transferabilities.

3. A method according to claim 1, wherein said first image forming elements comprise three species respectively containing yellow, magenta and cyan colorants, and said second image forming element contain a red colorant and are capable of decreasing their transferability under any one of said two energy application conditions under which said first image forming elements respectively containing yellow and magenta colorants decrease their transferabilities.

4. A method according to claim 1, wherein said first and second image forming elements comprise microcapsules.

5. A method according to claim 1, wherein said transferable image pattern is transferred to the transfer-receiving medium under heating.

6. A method according to claim 1, wherein said transferable image pattern is transferred to the transfer-receiving medium under pressure.

7. A method according to claim 1, wherein said transferable image pattern is transferred to the transfer-receiving medium under heating and pressure.

8. A method according to claim 1, wherein said transferable image pattern is transferred to the transfer-receiving medium under heating based on the application of a heat energy a quantity of which is smaller than that of the heat energy applied to the recording medium when the transferability of the first image forming element is decreased.

9. A recording medium comprising:

a substrate and a distributed layer disposed thereon, said distributed layer comprising a plurality of first particulate image forming elements and a plurality of second particulate image forming elements;

said first image forming elements comprising at least two species of material each having different coloring characteristics, said at least two species of material decreasing their transferabilities under at least two energy application conditions, each said species of material decreasing its transferability under a particular and corresponding energy application condition which involves the application of light energy and heat energy, each said energy application condition corresponding to a different said species of material;

said second image forming elements being capable of decreasing their transferability under any one of said at least two energy application conditions, said first and second image forming elements being capable of being hardened to decrease their transferabilities, said second image forming elements having a coloring characteristic which is different from that of said first image forming elements.

10. A recording medium according to claim 9, wherein said first image forming elements comprise three species respectively containing yellow, magenta and cyan colorants, and said second image forming element contains a black colorant and is capable of decreasing its transferability under any one of the three energy application conditions under which said three species of first image forming elements respectively decrease their transferabilities.

11. A recording medium according to claim 9, wherein said first image forming elements comprise three species respectively containing yellow, magenta and cyan colorants, and said second image forming elements contain a red colorant and are capable of decreasing their transferability under any one of said two energy application conditions under which said first image forming elements respectively containing yellow and magenta colorants decrease their transferabilities.

12. A recording medium according to claim 9, wherein said first and second image forming elements comprise microcapsules.

\* \* \* \* \*

UNITED STATES PATENT AND TRADEMARK OFFICE
CERTIFICATE OF CORRECTION

PATENT NO. : 5,573,885
DATED : November 12, 1996
INVENTOR(S) : TOSHIHARU INUI, ET AL.          Page 1 of 2

It is certified that error appears in the above-indentified patent and that said Letters Patent is hereby corrected as shown below:

COLUMN 1

Line 7, "abandonded" should read --abandoned--.

COLUMN 3

Line 20, "U.S." should read --U.S. Pat.--.

COLUMN 6

Line 40, "20eare" should read --20e are--.

COLUMN 7

Line 45, "When," should read --When--.

COLUMN 8

Line 18, "is" should be deleted.

COLUMN 9

Line 24, "embodimentan," should read --an embodiment,--.
   Line 51, "acenaphtylenequinone" should read --acenaphthylenequinone--.

COLUMN 12

Line 45, "on" should read --one--.

COLUMN 23

Table 10, "diethyaminocoumarin" should read --diethylaminocoumarin--.

UNITED STATES PATENT AND TRADEMARK OFFICE
CERTIFICATE OF CORRECTION

PATENT NO. : 5,573,885
DATED : November 12, 1996
INVENTOR(S) : TOSHIHARU INUI, ET AL.

It is certified that error appears in the above-indentified patent and that said Letters Patent is hereby corrected as shown below:

<u>COLUMN 25</u>

Line 6, "diethyamino-" should read --diethylamino- --.

<u>COLUMN 27</u>

Line 10, "element" should read --elements--.

Signed and Sealed this

Thirteenth Day of May, 1997

Attest:

BRUCE LEHMAN

*Attesting Officer*    *Commissioner of Patents and Trademarks*